(12) United States Patent  
Jensen et al.

(10) Patent No.: US 9,102,034 B2  
(45) Date of Patent: Aug. 11, 2015

(54) METHOD OF CHEMICAL MECHANICAL POLISHING A SUBSTRATE

(71) Applicants: Rohm and Haas Electronic Materials CMP Holdings, Inc., Newark, DE (US); Dow Global Technologies LLC, Midland, MI (US)

(72) Inventors: Michelle Jensen, Newark, DE (US); Bainian Qian, Newark, DE (US); Fengji Yeh, Wilmington, DE (US); Marty W. DeGroot, Middletown, DE (US); Mohammad T. Islam, Newark, DE (US); Matthew Richard Van Hanehem, Middletown, DE (US); Darrell String, Havre de Grace, MD (US); James Murnane, Norristown, PA (US); Jeffrey James Hendron, Elkton, MD (US); John G. Nowland, Elkton, MD (US)

(73) Assignees: Rohm and Haas Electronic Materials CMP Holdings, Inc., Newark, DE (US); Dow Global Technologies LLC, Midland, MI (US)

( * ) Notice: Subject to any disclaimer, the term of this patent is extended or adjusted under 35 U.S.C. 154(b) by 168 days.

(21) Appl. No.: 14/014,498

(22) Filed: Aug. 30, 2013

(65) Prior Publication Data  
US 2015/0065014 A1  Mar. 5, 2015

(51) Int. Cl.  
*B24B 37/24* (2012.01)  
*B24B 1/00* (2006.01)  
*C08G 18/10* (2006.01)  
*H01L 21/321* (2006.01)  
*H01L 21/306* (2006.01)  
*B24B 37/20* (2012.01)  
*B24B 37/22* (2012.01)

(52) U.S. Cl.  
CPC . *B24B 37/24* (2013.01); *B24B 1/00* (2013.01); *B24B 37/205* (2013.01); *B24B 37/22* (2013.01); *C08G 18/10* (2013.01); *H01L 21/30625* (2013.01); *H01L 21/3212* (2013.01)

(58) Field of Classification Search  
None  
See application file for complete search history.

(56) References Cited

U.S. PATENT DOCUMENTS

| 5,212,910 A | 5/1993 | Breivogel et al. |
| 5,245,790 A * | 9/1993 | Jerbic ............................ 451/159 |
| 5,257,478 A | 11/1993 | Hyde et al. |

(Continued)

OTHER PUBLICATIONS

Copending U.S. Appl. No. 14/014,468.

*Primary Examiner* — Lan Vinh  
*Assistant Examiner* — Jiong-Ping Lu  
(74) *Attorney, Agent, or Firm* — Thomas S. Deibert

(57) ABSTRACT

A method of chemical mechanical polishing a substrate is provided, including: providing a substrate; providing a chemical mechanical polishing pad, comprising: a polishing layer having a composition and a polishing surface, wherein the composition of polishing layer is selected to exhibit an initial hydrolytic stability; coupled with a sustained hydrolytic instability; a rigid layer having a top surface and a bottom surface; a hot melt adhesive interposed between the base surface of the polishing layer and the top surface of the rigid layer; wherein the hot melt adhesive bonds the polishing layer to the rigid layer; a pressure sensitive platen adhesive layer having a stack side and a platen side; wherein the stack side of the pressure sensitive platen adhesive layer is adjacent to the bottom surface of the rigid layer; and, creating dynamic contact between the polishing surface and substrate to polish a surface of the substrate.

11 Claims, 10 Drawing Sheets

(56) References Cited

U.S. PATENT DOCUMENTS

| | | | |
|---|---|---|---|
| 5,287,663 A | 2/1994 | Pierce et al. | |
| 5,489,233 A | 2/1996 | Cook et al. | |
| 5,632,789 A * | 5/1997 | Ryoke et al. | 51/295 |
| 5,692,950 A | 12/1997 | Rutherford et al. | |
| 5,752,875 A | 5/1998 | Ronay | |
| 6,454,634 B1 | 9/2002 | James et al. | |
| 6,524,164 B1 | 2/2003 | Tolles | |
| 6,561,891 B2 | 5/2003 | Eppert, Jr. et al. | |
| 6,749,485 B1 | 6/2004 | James et al. | |
| 7,101,275 B2 | 9/2006 | Roberts et al. | |
| 7,132,033 B2 | 11/2006 | Boldizar et al. | |
| 7,455,571 B1 * | 11/2008 | Kuo et al. | 451/41 |
| 7,569,268 B2 | 8/2009 | Crkvenac et al. | |
| 7,704,125 B2 | 4/2010 | Roy et al. | |
| 8,066,552 B2 | 11/2011 | Duboust et al. | |
| 8,277,290 B2 | 10/2012 | Chiu et al. | |
| 8,288,448 B2 | 10/2012 | Kulp | |
| 2009/0062414 A1 | 3/2009 | Huang et al. | |
| 2010/0035529 A1 | 2/2010 | Kulp et al. | |
| 2011/0021123 A1 | 1/2011 | Kulp et al. | |
| 2011/0054057 A9 * | 3/2011 | Kulp | 521/159 |
| 2011/0130077 A1 | 6/2011 | Litke et al. | |
| 2012/0015519 A1 | 1/2012 | Huang et al. | |
| 2012/0258649 A1 | 10/2012 | Zhang et al. | |
| 2012/0309270 A1 | 12/2012 | Shimizu et al. | |
| 2013/0084702 A1 | 4/2013 | Xie et al. | |
| 2013/0125473 A1 | 5/2013 | Zhang et al. | |

* cited by examiner

METHOD OF CHEMICAL MECHANICAL POLISHING A SUBSTRATE

The present invention relates to a method of chemical mechanical polishing a substrate. More particularly, the present invention relates to a method of chemical mechanical polishing a substrate, comprising: providing a substrate; providing a chemical mechanical polishing pad, comprising: a polishing layer having a composition and a polishing surface, wherein the composition of polishing layer is selected to exhibit an initial hydrolytic stability; coupled with a sustained hydrolytic instability; a rigid layer having a top surface and a bottom surface; a hot melt adhesive interposed between the base surface of the polishing layer and the top surface of the rigid layer; wherein the hot melt adhesive bonds the polishing layer to the rigid layer; a pressure sensitive platen adhesive layer having a stack side and a platen side; wherein the stack side of the pressure sensitive platen adhesive layer is adjacent to the bottom surface of the rigid layer; and, creating dynamic contact between the polishing surface and substrate to polish a surface of the substrate.

The production of semiconductors typically involves several chemical mechanical planarization (CMP) processes. In each CMP process, a polishing pad in combination with a polishing solution, such as an abrasive-containing polishing slurry or an abrasive-free reactive liquid, removes excess material in a manner that planarizes or maintains flatness for receipt of a subsequent layer. The stacking of these layers combines in a manner that forms an integrated circuit. The fabrication of these semiconductor devices continues to become more complex due to requirements for devices with higher operating speeds, lower leakage currents and reduced power consumption. In terms of device architecture, this translates to finer feature geometries and increased metallization levels. These increasingly stringent device design requirements are driving the adoption of copper metallization in conjunction with new dielectric materials having lower dielectric constants.

One of the most significant challenges in chemical mechanical polishing is achieving a desirable balance between planarization of the surface features on a semiconductor wafer while simultaneously minimizing defect formation, in particular scratch defects that lead to lower device yield. Conventional wisdom is that the balance of planarization and defects is a function of the hardness of the polymer material used in the polishing layer of the chemical mechanical polishing pad. That is, conventional wisdom is that harder polishing layer materials provide higher planarization along with higher defect counts, and vice-versa. It would be desirable to identify methods for breaking this trade-off between planarization and defect formation in chemical mechanical polishing.

In chemical mechanical polishing processes an aqueous polishing solution is typically interposed between the polishing surface of a polishing layer and the surface of a substrate being polished. Accordingly, conventional wisdom is that the polishing layer materials used for chemical mechanical polishing should remain hydrolytically stable upon extended exposure to water.

A family of polyurethane polishing layers is disclosed by Kulp in U.S. Pat. No. 8,288,448. Kulp discloses a polishing pad that includes a cast polyurethane polymeric material formed with an isocyanate-terminated reaction product formed from a prepolymer reaction of a prepolymer polyol and a polyfunctional isocyanate. The isocyanate-terminated reaction product has 4.5 to 8.7 weight percent unreacted NCO; and the isocyanate-terminated reaction product is cured with a curative agent selected from the group comprising curative polyamines, curative polyols, curative alcoholamines and mixtures thereof.

Notwithstanding, there is a continuing need for improved methods of chemical mechanical polishing that provides a higher degree of planarization while minimizing defect formation.

The present invention provides a method of chemical mechanical polishing a substrate, comprising: providing a substrate selected from at least one of a magnetic substrate, an optical substrate and a semiconductor substrate; providing a chemical mechanical polishing pad, comprising: (A) a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; (B) a rigid layer having a top surface and a bottom surface; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

The present invention provides a method of chemical mechanical polishing a substrate, comprising: providing a semiconductor substrate; providing a chemical mechanical polishing pad, comprising: (A) a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; (B) a rigid layer having a top surface and a bottom surface; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

The present invention provides a method of chemical mechanical polishing a substrate, comprising: providing a semiconductor substrate, wherein the semiconductor substrate has an exposed copper surface; providing a chemical mechanical polishing pad, comprising: (A) a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; (B) a rigid layer having a top surface and a bottom surface; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate, wherein at least some of the exposed copper surface is polished away from the surface of the substrate.

The present invention provides a method of chemical mechanical polishing a substrate, comprising: providing a substrate selected from at least one of a magnetic substrate, an optical substrate and a semiconductor substrate; providing a chemical mechanical polishing pad, comprising: (A) a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; (B) a rigid layer having a top surface and a bottom surface; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

The present invention provides a method of chemical mechanical polishing a substrate, comprising: providing a substrate selected from at least one of a magnetic substrate, an optical substrate and a semiconductor substrate; providing a chemical mechanical polishing pad, comprising: (A) a polishing layer having a composition and a polishing surface; wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; wherein the composition of the polishing layer is a cast polyurethane, wherein the cast polyurethane is a reaction product of ingredients, comprising: (a) an isocyanate terminated prepolymer obtained by reaction of: (i) a polyfunctional isocyanate; and, (ii) a polyether based polyol; wherein the isocyanate terminated prepolymer; (b) a curative agent, wherein the curative agent is selected from the group consisting of curative polyamines, curative polyols, curative alcoholamines and mixtures thereof; and, (c) optionally, a plurality of microelements; wherein the polishing layer exhibits a density of greater than 0.6; a Shore D hardness of 60 to 90; and, an elongation to break of 100 to 300%; and, wherein the polishing surface is adapted for polishing the substrate; (B) a rigid layer having a top surface and a bottom surface; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

The present invention provides a method of chemical mechanical polishing a substrate, comprising: providing a substrate selected from at least one of a magnetic substrate, an optical substrate and a semiconductor substrate; providing a chemical mechanical polishing pad, comprising: (A) a polishing layer having a composition and a polishing surface; wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; wherein the composition of the polishing layer is a cast polyurethane, wherein the cast polyurethane is a reaction product of ingredients, comprising: (a) an isocyanate terminated prepolymer obtained by reaction of: (i) a polyfunctional isocyanate; and, (ii) a polyether based polyol; wherein the isocyanate terminated prepolymer; (b) a curative agent, wherein the curative agent is selected from the group consisting of curative polyamines, curative polyols, curative alcoholamines and mixtures thereof, wherein the curative and the isocyanate terminated prepolymer have an OH or $NH_2$ to unreacted NCO stoichiometric ratio of 80 to 120 percent; and, (c) optionally, a plurality of microelements; wherein the polishing layer exhibits a density of greater than 0.6; a Shore D hardness of 60 to 90; and, an elongation to break of 100 to 300%; and, wherein the polishing surface is adapted for polishing the substrate; (B) a rigid layer having a top surface and a bottom surface; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

The present invention provides a method of chemical mechanical polishing a substrate, comprising: providing a substrate selected from at least one of a magnetic substrate, an optical substrate and a semiconductor substrate; providing a chemical mechanical polishing pad, comprising: (A) a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; (B) a rigid layer having a top surface and a bottom surface, wherein the top surface of the rigid layer is ungrooved and wherein the bottom surface of the rigid layer is ungrooved; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

The present invention provides a method of chemical mechanical polishing a substrate, comprising: providing a substrate selected from at least one of a magnetic substrate, an optical substrate and a semiconductor substrate; providing a chemical mechanical polishing pad, comprising: (A) a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; (B) a rigid layer having a top surface and a bottom surface, wherein the top surface and the bottom surface of the rigid layer have a roughness, Ra, of 1 to 500 nm; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

The present invention provides a method of chemical mechanical polishing a substrate, comprising: providing a substrate selected from at least one of a magnetic substrate, an optical substrate and a semiconductor substrate; providing a chemical mechanical polishing pad, comprising: (A) a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; (B) a rigid layer having a top surface and a bottom surface, wherein the rigid layer is made of a biaxially oriented polyethylene terephthalate, wherein the rigid layer has an average thickness of 6 to 15 mils, and wherein the rigid layer exhibits a Young's Modulus of 3,000 to 7,000 MPa; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

The present invention provides a method of chemical mechanical polishing a substrate, comprising: providing a substrate selected from at least one of a magnetic substrate, an optical substrate and a semiconductor substrate; providing a chemical mechanical polishing pad, comprising: (A) a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; (B) a rigid layer having a top surface and a bottom surface; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

DETAILED DESCRIPTION

Conventional polishing layer compositions have been designed using materials that exhibit both hydrolytic stability and extended hydrolytic stability. The conventional wisdom is that materials need to remain dimensionally stable upon long term immersion in water for use in chemical mechanical polishing layer compositions. Applicant has surprisingly found that a method of chemical mechanical polishing a substrate, comprising: providing a chemical mechanical polishing pad, having a polishing layer having a composition and a polishing surface, wherein the composition of polishing layer is selected to exhibit (i) an initial hydrolytic stability; coupled with (ii) a sustained hydrolytic instability; provides improved planarization performance while minimizing defects, in particular, scratch defects that can lead to lower device yields. The unique balance of properties exhibited by the polishing layer provided in the method of the present invention enables, for example, the effective planarization of semiconductor wafers having exposed copper features with minimal defect formation.

Figure 1:
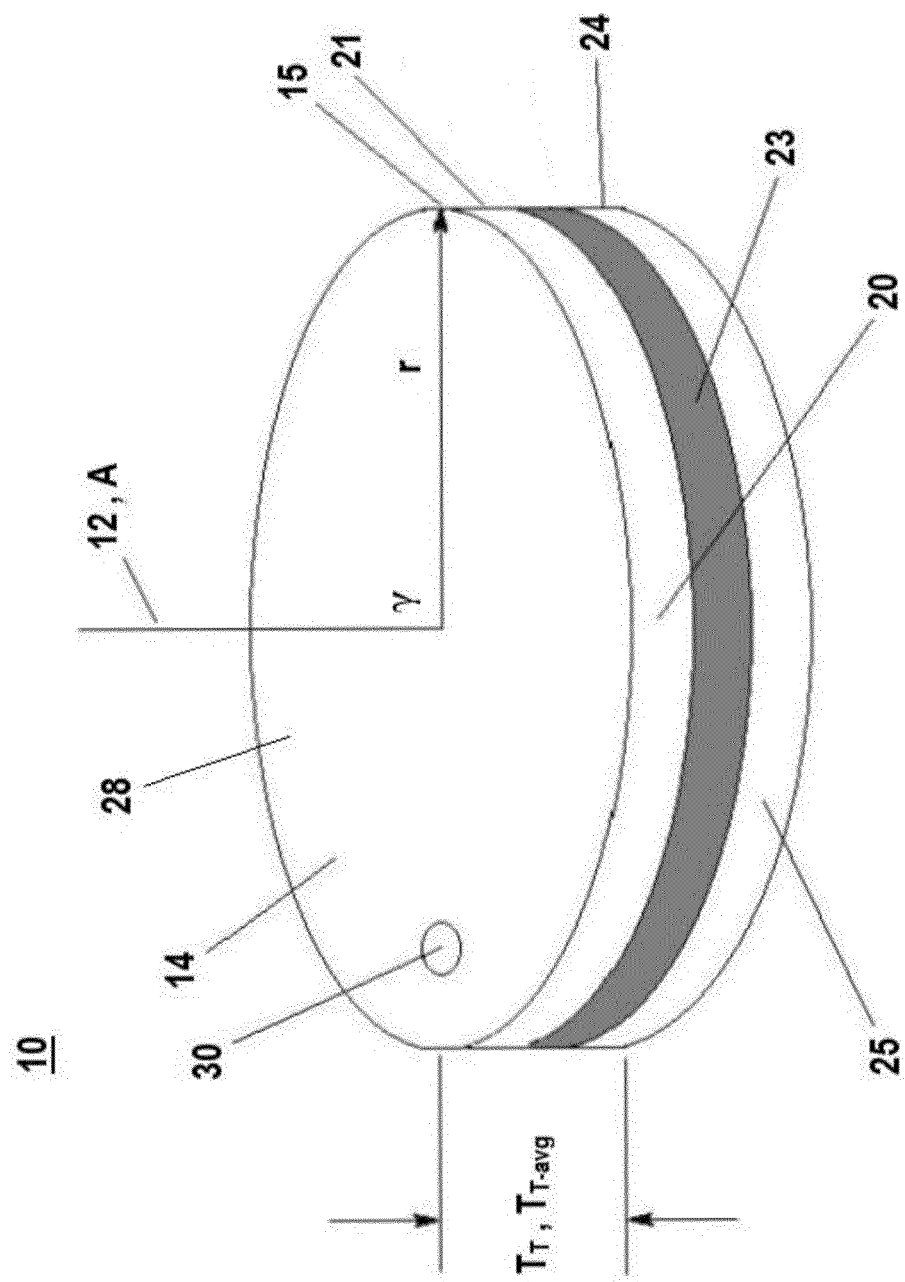
FIG. 1 is a depiction of a perspective view of a chemical mechanical polishing pad used in the method of the present invention.
Figure 2:
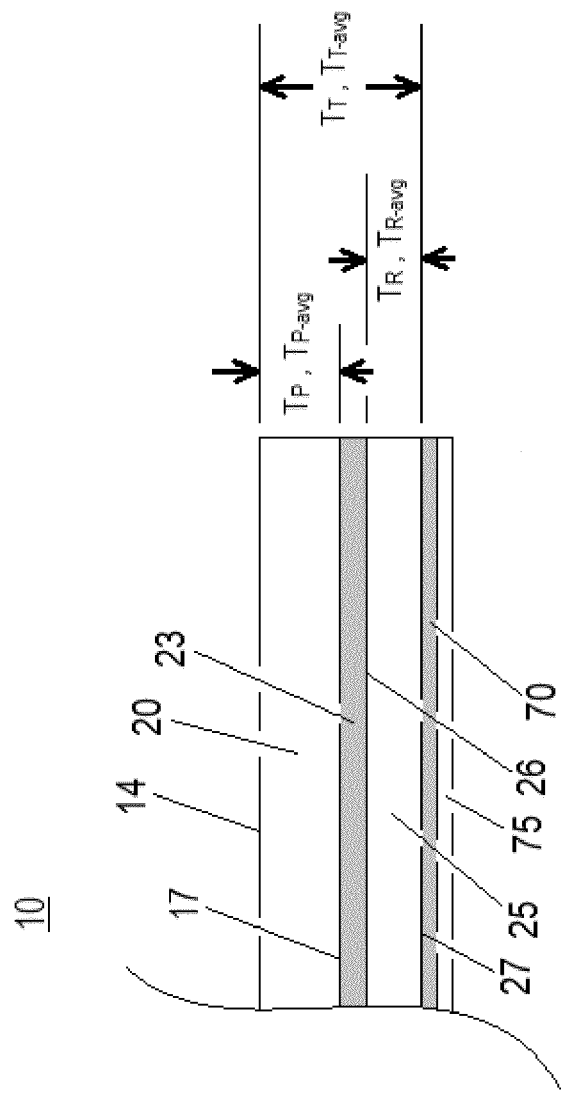
FIG. 2 is a depiction of a cross sectional, cut away, elevational view of a chemical mechanical polishing pad used in the method of the present invention.
Figure 5:
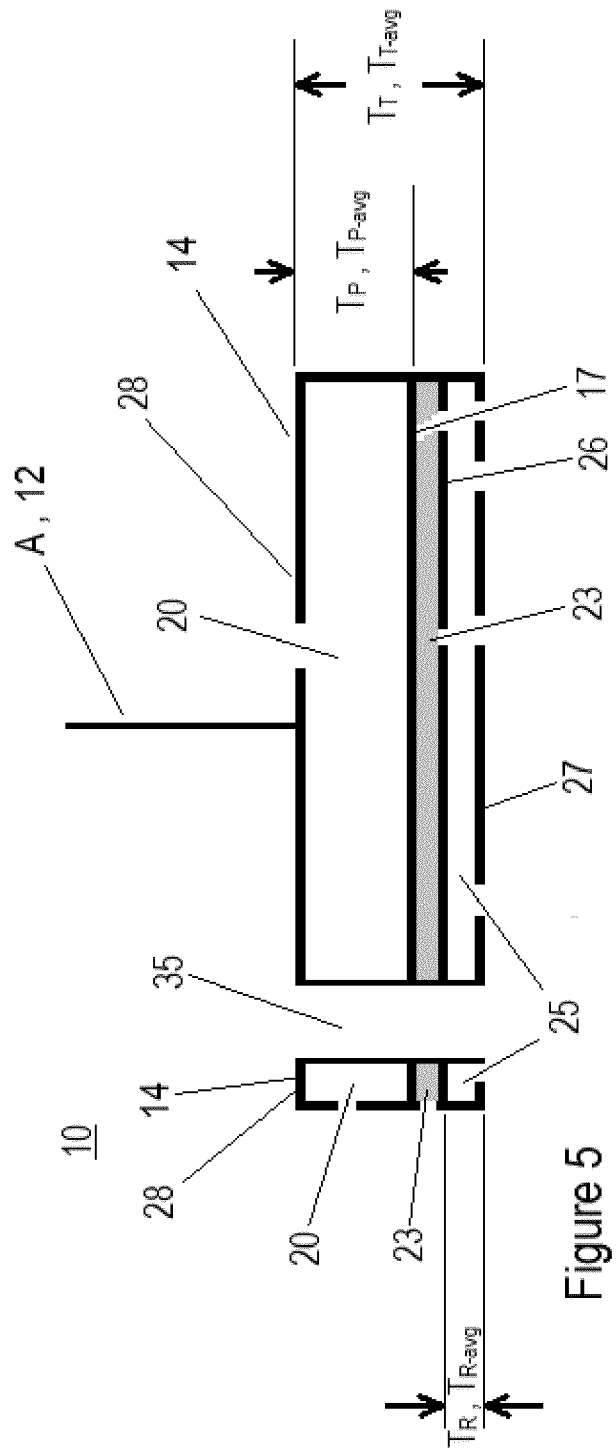
FIG. 5 is a depiction of a cross sectional, cut away, elevational view of a chemical mechanical polishing pad used in the method of the present invention.
Figure 7:
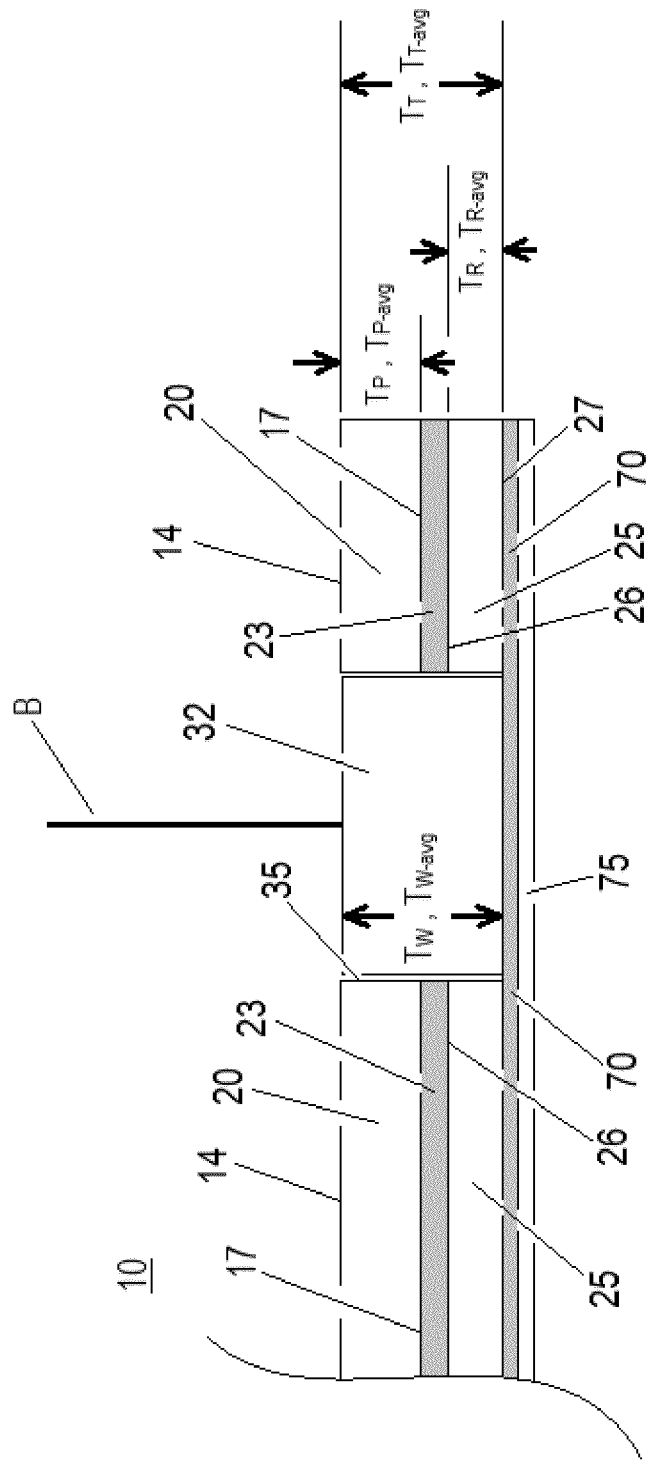
FIG. 7 is a depiction of a cross sectional, cut away, elevational view of a chemical mechanical polishing pad used in the method of the present invention with a plug in place window block.
Figure 8:
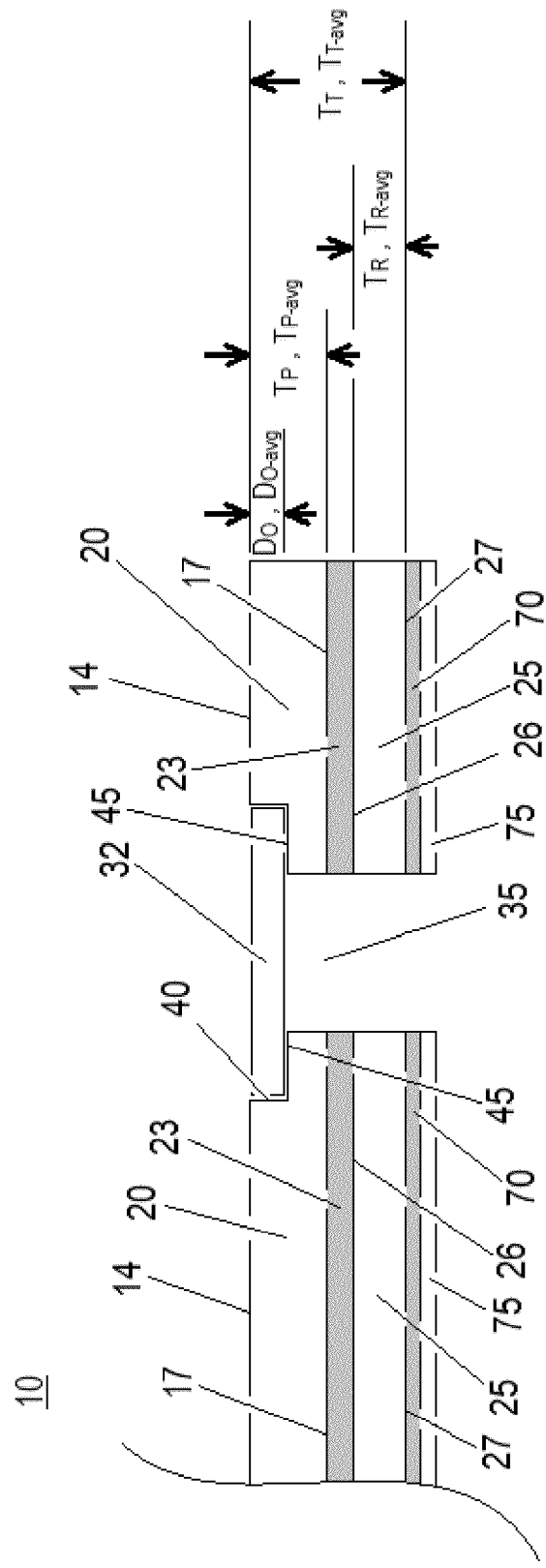
FIG. 8 is a depiction of a cross sectional, cut away, elevational view of a chemical mechanical polishing pad used in the method of the present invention with a plug in place window block.
Figure 9:
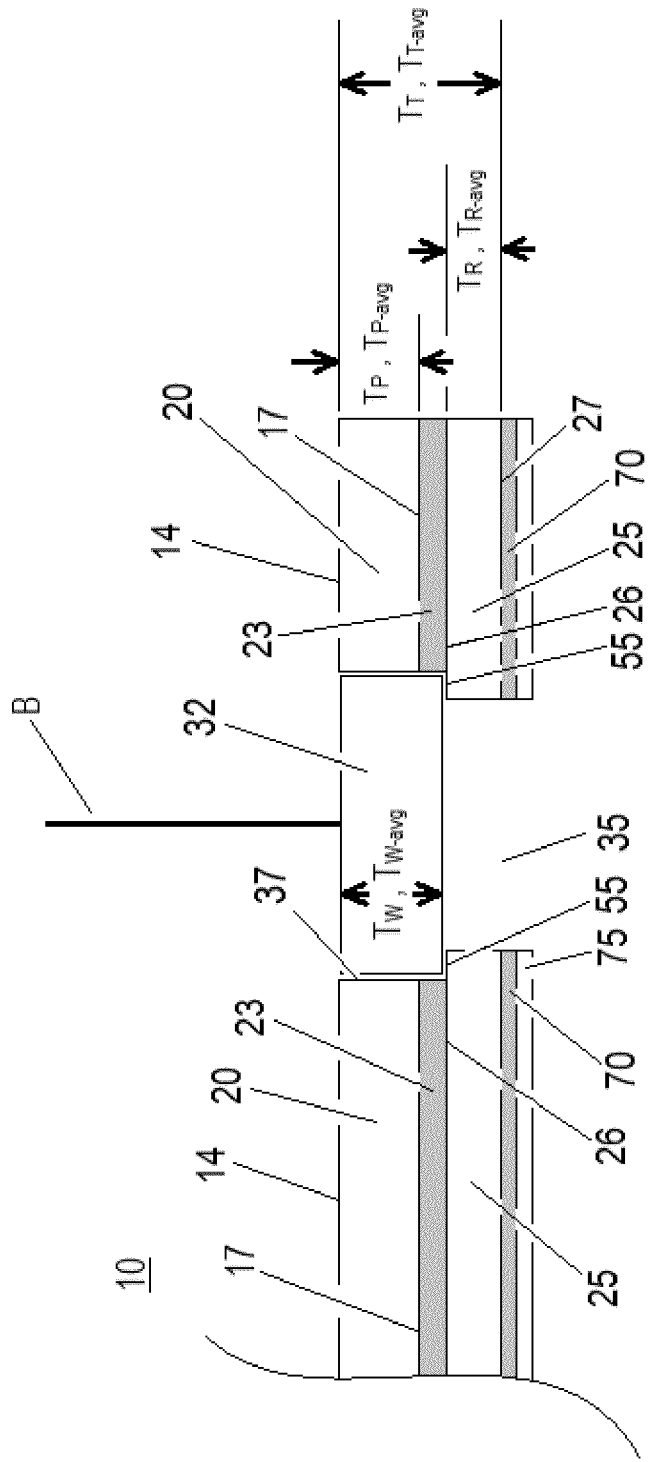
FIG. 9 is a depiction of a cross sectional, cut away, elevational view of a chemical mechanical polishing pad used in the method of the present invention with a plug in place window block.
Figure 10:
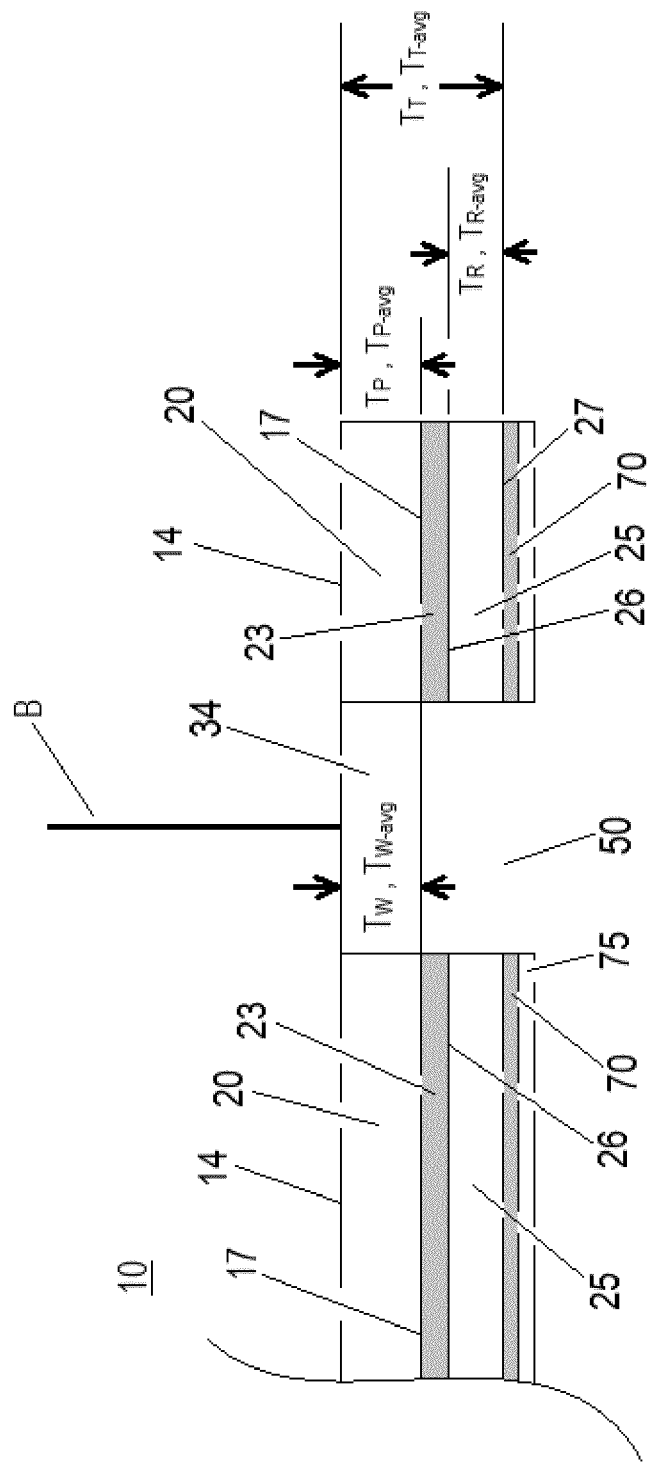
FIG. 10 is a depiction of a cross sectional, cut away, elevational view of a chemical mechanical polishing pad used in the method of the present invention with an integral window.

The term "average total thickness, $T_{T\text{-}avg}$" as used herein and in the appended claims in reference to a chemical mechanical polishing pad (10) having a polishing surface (14) means the average thickness, $T_T$, of the chemical mechanical polishing pad measured in a direction normal to the polishing surface (14) from the polishing surface (14) to the bottom surface (27) of the rigid layer (25). (See FIGS. 1, 2, 5 and 7-10).

The term "initial hydrolytic stability" as used herein and in the appended claims in reference to a polishing layer means that a linear dimension of a sample of the polishing layer changes by <1% following immersion in deionized water for 24 hours at 25° C., as measured according to the procedure set forth in the Examples.

The term "extended hydrolytic stability" as used herein and in the appended claims in reference to a polishing layer means that a liner dimension of a sample of the polishing layer changes by <1.75% following immersion in deionized water for 7 days at 25° C., as measured according to the procedure set forth in the Examples.

The term "sustained hydrolytic instability" as used herein and in the appended claims in reference to a polishing layer means that a linear dimension of a sample of the polishing layer changes by ≥1.75% following immersion in deionized water for 7 days at 25° C., as measured according to the procedure set forth in the Examples.

The term "substantially circular cross section" as used herein and in the appended claims in reference to a chemical mechanical polishing pad (10) means that the longest radius, r, of the cross section from the central axis (12) to the outer perimeter (15) of the polishing surface (14) of the polishing layer (20) is ≤20% longer than the shortest radius, r, of the cross section from the central axis (12) to the outer perimeter (15) of the polishing surface (14). (See FIG. 1).

The method of chemical mechanical polishing a substrate of the present invention, comprises: providing a substrate selected from at least one of a magnetic substrate, an optical substrate and a semiconductor substrate; providing a chemical mechanical polishing pad, comprising: (A) a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer by ≥1.75% following immersion in deionized water for seven days at 25° C.; (B) a rigid layer having a top surface and a bottom surface; (C) a hot melt adhesive interposed between the base surface of the polishing layer and the top surface of the rigid layer; wherein the hot melt adhesive bonds the polishing layer to the rigid layer; (D) a pressure sensitive platen adhesive layer having a stack side and a platen side; wherein the stack side of the pressure sensitive platen adhesive layer is adjacent to the bottom surface of the rigid layer; (E) optionally, a release liner, wherein the optional release liner is disposed on the platen side of the pressure sensitive platen adhesive layer; (F) optionally, an endpoint detection window; and, (G) optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

Preferably, the substrate provided in the method of the present invention is a semiconductor substrate. More preferably, the substrate provided is a semiconductor substrate having a surface with exposed copper features.

Figure 3:
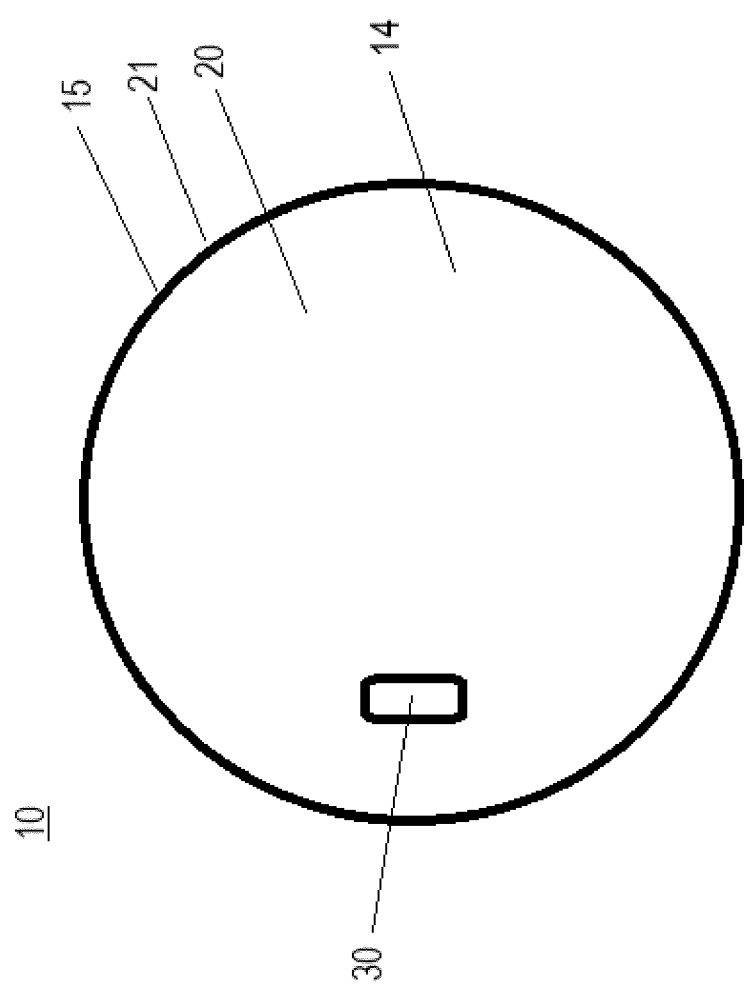
FIG. 3 is a top plan view of a chemical mechanical polishing pad used in the method of the present invention.
Figure 4:
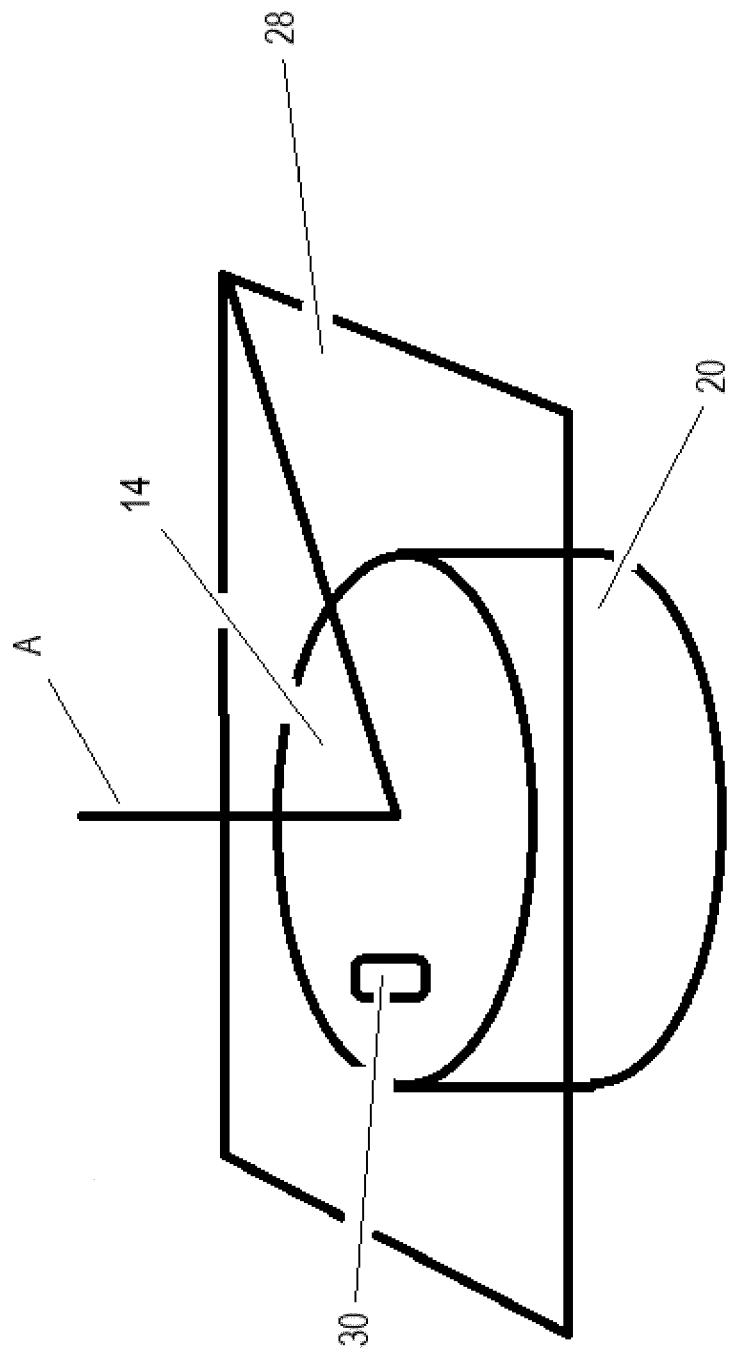
FIG. 4 is a side perspective view of a polishing layer used in the method of the present invention.
Figure 6:
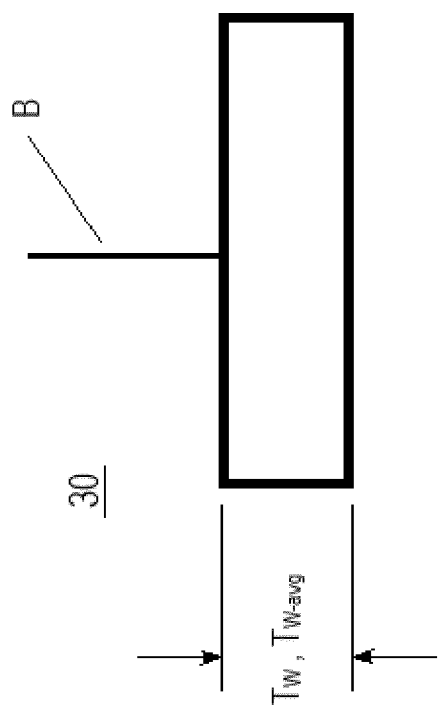
FIG. 6 is an elevational view of a plug in place window block used in the method of the present invention.

Preferably, the chemical mechanical polishing pad (10) provided in the method of the present invention, comprises: a polishing layer (20) having a polishing surface (14), a base surface (17) and an average thickness, $T_{P\text{-}avg}$, measured in a direction perpendicular to the polishing surface (14) from the polishing surface (14) to the base surface (17); a rigid layer (25) having a top surface (26) and a bottom surface (27); a hot melt adhesive (23) interposed between the base surface (17) of the polishing layer (20) and the top surface (26) of the rigid layer (25); wherein the hot melt adhesive (23) bonds the polishing layer (20) to the rigid layer (25); optionally, a pressure sensitive platen adhesive layer (70) having a stack side (72) and a platen side (74); wherein the pressure sensitive platen adhesive layer (70) is disposed on the bottom surface (27) of the rigid layer (25) (preferably, wherein the optional pressure sensitive platen adhesive layer facilitates mounting of the chemical mechanical polishing pad on a polishing machine); optionally, a release liner (75); wherein the pressure sensitive platen adhesive layer (70) is interposed between the bottom surface (27) of the rigid layer (25) and the optional release liner (75); optionally, an endpoint detection window (30) (preferably, wherein the endpoint detection window facilitates in situ polishing endpoint detection); and, optionally, at least one additional layer (not shown) interfaced with and interposed between the bottom surface (27) of the rigid layer (25) and the stack side (72) pressure sensitive platen adhesive layer (70). (See FIGS. 1-10).

Preferably, the chemical mechanical polishing pad (10) provided in the method of the present invention is adapted for rotation about a central axis (12). (See FIG. 1). Preferably, the polishing surface (14) of polishing layer (20) is in a plane (28) perpendicular to the central axis (12). The chemical mechanical polishing pad (10) provided in the method of the present invention is preferably adapted for rotation in a plane (28) that is at an angle, γ, of 85 to 95° to the central axis (12), preferably, of 90° to the central axis (12). Preferably, the polishing layer (20) has a polishing surface (14) that has a substantially circular cross section perpendicular to the central axis (12). Preferably, the radius, r, of the cross section of the polishing surface (14) perpendicular to the central axis (12) varies by ≤20% for the cross section, more preferably by ≤10% for the cross section.

Preferably, the chemical mechanical polishing pad provided in the method of the present invention is specifically designed to facilitate the polishing of a substrate selected from at least one of a magnetic substrate, an optical substrate and a semiconductor substrate. Preferably, the chemical mechanical polishing pad of the present invention is designed to facilitate the polishing of a semiconductor substrate. More preferably, the chemical mechanical polishing pad of the present invention is designed to facilitate the polishing of exposed copper features on the surface of a semiconductor wafer substrate.

The chemical mechanical polishing pad provided in the method of the present invention, comprises: a polishing layer having a composition, wherein the composition of polishing layer is selected to exhibit (i) an initial hydrolytic stability, wherein a linear dimension of a sample of the polishing layer changes by <1% following immersion in deionized water for 24 hours at 25° C.; coupled with (ii) a sustained hydrolytic instability, wherein the linear dimension of the sample of the polishing layer changes by ≥1.75% following immersion in deionized water for seven days at 25° C.

Preferably, the composition of the polishing layer used in the chemical mechanical polishing pad provided in the method of the present invention is selected from the group consisting of poly(urethane), polysulfone, polyether sulfone, nylon, polyether, polyester, polystyrene, acrylic polymer, polyurea, polyamide, polyvinyl chloride, polyvinyl fluoride, polyethylene, polypropylene, polybutadiene, polyethylene imine, polyacrylonitrile, polyethylene oxide, polyolefin, poly(alkyl)acrylate, poly(alkyl)methacrylate, polyamide, polyether imide, polyketone, epoxy, silicone, polymer formed from ethylene propylene diene monomer, protein, polysaccharide, polyacetate and a combination of at least two of the foregoing. Preferably, the composition of the polishing layer used in the chemical mechanical polishing pad provided in the method of the present invention comprises a poly(urethane). More preferably, the composition of the polishing layer used in the chemical mechanical polishing pad provided in the method of the present invention is a polyurethane.

Preferably, the composition of the polishing layer used in the chemical mechanical polishing pad provided in the method of the present invention is a reaction product of a polyisocyanate (e.g., diisocyanate); a hydroxyl-containing material; and, optionally, a curative agent.

Preferable, polyisocyantes include methylene bis 4,4'-cyclohexyl-isocyanate; cyclohexyl diisocyanate; isophorone diisocyanate; hexamethylene diisocyanate; propylene-1,2-dissocyanate; tetramethylene-1,4-diisocyanate; 1,6-hexamethylene-diisocyanate; dodecane-1,12-diisocyanate; cyclobutane-1,3-diisocyanate; cyclohexane-1,3-diisocyanate; cyclohexane-1,4-diisocyanate; 1-isocyanato-3,3,5-trimethyl-5-isocyanatomethylcyclohexane; methyl cyclohexylene diisocyanate; triisocyanate of hexamethylene diisocyanate; triisocyanate of 2,4,4-trimethyl-1,6-hexane diisocyanate; urtdione of hexamethylene diisocyanate; ethylene diisocyanate; 2,2,4-trimethylhexamethylene diisocyanate; 2,4,4-tri-methylhexamethylene diisocyanate; dicyclohexylmethane diisocyanate; and combinations thereof. More preferably, the polyisocyanate is aliphatic and has less than 14 percent unreacted isocyanate groups.

Preferable, hydroxyl-containing materials include polyols. Exemplary polyols include, for example, polyether polyols, hydroxy-terminated polybutadiene (including partially and fully hydrogenated derivatives), polyester polyols, polycaprolactone polyols, polycarbonate polyols, and mixtures thereof.

Preferred polyols include polyether polyols. Examples of polyether polyols include polytetramethylene ether glycol ("PTMEG"), polyethylene propylene glycol, polyoxypropylene glycol, and mixtures thereof. The hydrocarbon chain can have saturated or unsaturated bonds and substituted or unsubstituted aromatic and cyclic groups. Preferably, the polyol of the present invention includes PTMEG. Preferred, polyester polyols include, but are not limited to, polyethylene adipate glycol; polybutylene adipate glycol; polyethylene propylene adipate glycol; o-phthalate-1,6-hexanediol; poly(hexamethylene adipate) glycol; and mixtures thereof. The hydrocarbon chain can have saturated or unsaturated bonds, or substituted or unsubstituted aromatic and cyclic groups. Preferred polycaprolactone polyols include, but are not limited to, 1,6-hexanediol-initiated polycaprolactone; diethylene glycol initiated polycaprolactone; trimethylol propane initiated polycaprolactone; neopentyl glycol initiated polycaprolactone; 1,4-butanediol-initiated polycaprolactone; PTMEG-initiated polycaprolactone; and mixtures thereof. The hydrocarbon chain can have saturated or unsaturated bonds, or substituted or unsubstituted aromatic and cyclic groups. Preferred polycarbonates include, but are not limited to, polyphthalate carbonate and poly(hexamethylene carbonate) glycol.

Preferred curative agents include diamines. Preferred polydiamines include both primary and secondary amines. More preferred polydiamines include diethyl toluene diamine ("DETDA"); 3,5-dimethylthio-2,4-toluenediamine and isomers thereof; 3,5-diethyltoluene-2,4-diamine and isomers thereof (e.g., 3,5-diethyltoluene-2,6-diamine); 4,4'-bis-(sec-butylamino)-diphenylmethane; 1,4-bis-(sec-butylamino)-benzene; 4,4'-methylene-bis-(2-chloroaniline); 4,4'-methylene-bis-(3-chloro-2,6-diethylaniline) ("MCDEA"); polytetramethyleneoxide-di-p-aminobenzoate; N,N'-dialkyl-diamino diphenyl methane; p,p'-methylene dianiline ("MDA"); m-phenylenediamine ("MPDA"); methylene-bis 2-chloroaniline ("MBOCA"); 4,4'-methylene-bis-(2-chloroaniline) ("MOCA"); 4,4'-methylene-bis-(2,6-diethylaniline) ("MDEA"); 4,4'-methylene-bis-(2,3-dichloroaniline) ("MDCA"); diphenylmethane, 2,2',3,3'-tetrachloro diamino diphenylmethane; trimethylene glycol di-p-aminobenzoate; and mixtures thereof.

Curative agents can also include diols, triols, tetraols and hydroxy-terminated curatives. Preferred diols, triols, and tetraol groups include ethylene glycol; diethylene glycol; polyethylene glycol; propylene glycol; polypropylene glycol; lower molecular weight polytetramethylene ether glycol; 1,3-bis(2-hydroxyethoxy) benzene; 1,3-bis-[2-(2-hydroxyethoxy) ethoxy]benzene; 1,3-bis-{2-[2-(2-hydroxyethoxy) ethoxy]ethoxy}benzene; 1,4-butanediol; 1,5-pentanediol; 1,6-hexanediol; resorcinol-di-(beta-hydroxyethyl)ether; hydroquinone-di-(beta-hydroxyethyl)ether; and mixtures thereof. Preferred hydroxy-terminated curatives include 1,3-bis(2-hydroxyethoxy) benzene; 1,3-bis-[2-(2-hydroxyethoxy) ethoxy]benzene; 1,3-bis-{2-[2-(2-hydroxyethoxy) ethoxy]ethoxy}benzene; 1,4-butanediol; and mixtures thereof. The hydroxy-terminated and diamine curatives can include one or more saturated, unsaturated, aromatic, and cyclic groups. Additionally, the hydroxy-terminated and diamine curatives can include one or more halogen groups.

Preferably, the polishing layer used in the chemical mechanical polishing pad provided in the method of the present invention contains a plurality of microelements. Preferably, the plurality of microelements are uniformly dispersed throughout the polishing layer used in the chemical mechanical polishing pad provided in the method of the present invention. Preferably, the plurality of microelements is selected from entrapped gas bubbles, hollow core polymeric materials, liquid filled hollow core polymeric materials, water soluble materials, an insoluble phase material (e.g., mineral oil) and combinations thereof. More preferably, the plurality of microelements is selected from entrapped gas bubbles and hollow core polymeric materials uniformly distributed throughout the polishing layer used in the chemical mechanical polishing pad provided in the method of the present invention. Preferably, the plurality of microelements has a weight average diameter of less than 150 µm (more preferably of less than 50 µm; most preferably of 10 to 50 µm). Preferably, the plurality of microelements comprise polymeric microballoons with shell walls of either polyacrylonitrile or a polyacrylonitrile copolymer (e.g., Expancel® from Akzo Nobel). Preferably, the plurality of microelements are incorporated into the polishing layer used in the chemical mechanical polishing pad provided in the method of the present invention at 0 to 35 vol % porosity (more preferably 10 to 25 vol % porosity).

The polishing layer used in the chemical mechanical polishing pad provided in the method of the present invention can be provided in both porous and nonporous (i.e., unfilled) configurations. Preferably, the polishing layer used in the chemical mechanical polishing pad provided in the method of the present invention exhibits a specific gravity of greater than 0.6 as measured according to ASTM D1622. More preferably, the polishing layer used in the chemical mechanical polishing pad provided in the method of the present invention exhibits a specific gravity of 0.6 to 1.5 (still more preferably 0.7 to 1.2; most preferably 0.95 to 1.2) as measured according to ASTM D1622.

Preferably, the polishing layer used in the chemical mechanical polishing pad provided in the method of the present invention exhibits a Shore D hardness of 60 to 90 as measured according to ASTM D2240. More preferably, the polishing layer used in the chemical mechanical polishing pad provided in the method of the present invention exhibits a Shore D hardness of >60 to 75 (more preferably, 61 to 75; most preferably, >65 to 70) as measured according to ASTM D2240.

Preferably, the polishing layer used in the chemical mechanical polishing pad provided in the method of the present invention exhibits an elongation to break of 100 to 300% as measured according to ASTM D412. Preferably, the polishing layer used in the chemical mechanical polishing pad provided in the method of the present invention exhibits an elongation to break of 100 to 200% (still more preferably 125 to 175%; most preferably 150 to 160%) as measured according to ASTM D412.

One of ordinary skill in the art will understand to select a polishing layer (20) having a thickness, $T_P$, suitable for use in a chemical mechanical polishing pad (10) provided in the method of the present invention for a given polishing operation. Preferably, the polishing layer (20) used in the chemical mechanical polishing pad (10) provided in the method of the present invention exhibits an average thickness, $T_{P-avg}$, along an axis (A) perpendicular to a plane (28) of the polishing surface (14). More preferably, the average thickness, $T_{P-avg}$, is 20 to 150 mils (more preferably 30 to 130 mils; most preferably 70 to 90 mils). (See FIGS. 2, 5 and 7-10).

Preferably, the polishing surface of the polishing layer used in the chemical mechanical polishing pad provided in the method of the present invention is adapted for polishing a substrate selected from at least one of a magnetic substrate, an optical substrate and a semiconductor substrate (more preferably, a semiconductor substrate; still more preferably, a semiconductor wafer; most preferably, a semiconductor wafer having a surface with exposed copper features). The polishing surface of the polishing layer used in the chemical mechanical polishing pad provided in the method of the present invention exhibits at least one of macrotexture and microtexture to facilitate polishing the substrate. Preferably, the polishing surface exhibits macrotexture, wherein the macrotexture is designed to do at least one of (i) alleviate at least one of hydroplaning; (ii) influence polishing medium flow; (iii) modify the stiffness of the polishing layer; (iv) reduce edge effects; and, (v) facilitate the transfer of polishing debris away from the area between the polishing surface and the substrate being polished.

The polishing surface preferably exhibits macrotexture selected from at least one of perforations and grooves. Preferably, the perforations can extend from the polishing surface part way or all of the way through the thickness of the polishing layer used in the chemical mechanical polishing pad provided in the method of the present invention. Preferably, the grooves are arranged on the polishing surface such that upon rotation of the pad during polishing, at least one groove sweeps over the substrate. Preferably, the grooves are selected from curved grooves, linear grooves and combinations thereof. The grooves exhibit a depth of ≥10 mils (preferably, 10 to 120 mils). Preferably, the grooves form a groove pattern that comprises at least two grooves having a combination of a depth selected from ≥10 mils, ≥15 mils and 15 to 120 mils; a width selected from ≥10 mils and 10 to 100 mils; and a pitch selected from ≥30 mils, ≥50 mils, 50 to 200 mils, 70 to 200 mils, and 90 to 200 mils.

Preferably, the polishing layer used in the chemical mechanical polishing pad provided in the method of the present invention contains <1 ppm abrasive particles incorporated therein.

A preferred polishing layer composition used in the chemical mechanical polishing pad provided in the method of the present invention is a polyurethane, wherein the polyurethane is a reaction product of ingredients, comprising: (a) a polypropylene glycol based isocyanate terminated urethane prepolymer obtained by reaction of: (i) a toluene diisocyanate (preferably, a toluene diisocyanate selected from the group consisting of 2,4-toluene diisocyanate; 2,6-toluene diisocyanate and mixtures thereof); and, (ii) a polypropylene glycol based polyol; wherein the isocyanate terminated prepolymer has 8 to 9.5 weight percent (preferably, 8.65 to 9.05 wt %; more preferably, >8.7 to 9 wt %) unreacted NCO; (b) a curative agent, wherein the curative agent is 4,4'-methylene-bis-(2-chloroaniline); and, (c) optionally, a plurality of microelements; wherein the polishing layer exhibits a specific gravity of greater than 0.6; a Shore D hardness of 60 to 90 (preferably, >60 to 75; more preferably, 61 to 75; most preferably, >65 to 70); and, an elongation to break of 100 to 300% (preferably, 100 to 200%; more preferably, 125 to 175%; most preferably, 150 to 160%); wherein the polishing layer exhibits an initial hydrolytic stability, wherein a linear dimension of a sample of the polishing layer changes by <1% following immersion in deionized water for 24 hours at 25° C. (as measured according to the method described in the Examples); wherein the polishing layer exhibits a sustained hydrolytic instability, wherein the linear dimension of the sample of the polishing layer changes by ≥1.75% (preferably, 1.75 to 5%; more preferably, 1.75 to 3.5%; most preferably, 2 to 3%) following immersion in deionized water for seven days at 25° C. (as measured according to the method described in the Examples). Preferably, the stoichiometric ratio of the reactive hydrogen groups (i.e., the sum of the amine ($NH_2$) groups and the hydroxyl (OH) groups) in the curative agent to the unreacted isocyanate (NCO) groups in the polypropylene glycol based isocyanate terminated urethane prepolymer used in the formation of the polishing layer used in the chemical mechanical polishing pad provided in the method of the present invention is 80 to <95 percent (more preferably, 85 to <95 percent; still more preferably, 87 to 94 percent; most preferably, 89 to 92 percent). Preferably, the polypropylene glycol based isocyanate terminated urethane prepolymer used in the formation of the polishing layer used in the chemical mechanical polishing pad provided in the method of the present invention is a low free isocyanate terminated urethane prepolymer having less than 0.1 wt % free toluene diisocyanate (TDI) monomer content.

Examples of commercially available polypropylene glycol based isocyanate terminated urethane prepolymers include Imuthane® prepolymers (available from COIM USA, Inc., such as, PPT-80A, PPT-90A, PPT-95A, PPT-65D, PPT-75D); Adiprene® prepolymers (available from Chemtura, such as, LFG 963A, LFG 964A, LFG 740D); and, Andur® prepolymers (available from Anderson Development Company, such as, 8000APLF, 9500APLF, 6500DPLF, 7501DPLF).

Preferably, the rigid layer (25) used in the chemical mechanical polishing pad (10) provided in the method of the present invention is made of a material selected from the group consisting of a polymer, a metal, a reinforced polymer and combinations thereof. More preferably, the rigid layer (25) used in the chemical mechanical polishing pad (10) provided in the method of the present invention is made of a polymer. Most preferably, the rigid layer (25) used in the chemical mechanical polishing pad (10) provided in the method of the present invention is made of a polymer selected from the group consisting of a polyester, a nylon, an epoxy, a fiberglass reinforced epoxy; and, a polycarbonate (more preferably, a polyester; still more preferably, a polyethylene terephthalate polyester; most preferably, a biaxially oriented polyethylene terephthalate polyester).

Preferably, the rigid layer (25) used in the chemical mechanical polishing pad (10) provided in the method of the present invention has an average thickness, $T_{R-avg}$, of >5 to 60 mils (more preferably, 6 to 15 mils; most preferably, 6 to 8 mils).

Preferably, the top surface (26) and the bottom surface (27) of the rigid layer (25) used in the chemical mechanical polishing pad (10) provided in the method of the present invention are both ungrooved. More preferably, the top surface (26) and the bottom surface (27) are both smooth. Most preferably, the top surface (26) and the bottom surface (27) have a roughness, Ra, of 1 to 500 nm (preferably, 1 to 100 nm; more preferably, 10 to 50 nm; most preferably 20 to 40 nm) as determined using an optical profilometer.

Preferably, the top surface (26) of the rigid layer (25) used in the chemical mechanical polishing pad (10) provided in the method of the present invention is treated with an adhesion promoter to improve adhesion between the rigid layer (25) and the reactive hot melt adhesive (23). One of ordinary skill in the art will know how to select an appropriate adhesion promoter given the material of construction of the rigid layer (25) and the composition of the hot melt adhesive (23).

Preferably, the rigid layer (25) used in the chemical mechanical polishing pad (10) provided in the method of the present invention exhibits a Young's Modulus, measured according to ASTM D882-12, of ≥100 MPa (more preferably, 1,000 to 10,000 MPa; still more preferably, 2,500 to 7,500 MPa; most preferably, 3,000 to 7,000 MPa).

Preferably, the rigid layer (25) used in the chemical mechanical polishing pad (10) provided in the method of the present invention exhibits a void fraction of <0.1 vol % (more preferably, <0.01 vol %).

Preferably, the rigid layer (25) used in the chemical mechanical polishing pad (10) provided in the method of the present invention is made of a biaxially oriented polyethylene terephthalate having an average thickness of 6 to 15 mils; and, a Young's Modulus, measured according to ASTM D882-12, of 2,500 to 7,500 MPa (most preferably, 3,000 to 7,000 MPa).

One of ordinary skill in the art will know how to select an appropriate hot melt adhesive (23) for use in the chemical mechanical polishing pad (10) provided in the method of the present invention. Preferably, the hot melt adhesive (23) is a cured reactive hot melt adhesive. More preferably, the hot melt adhesive (23) is a cured reactive hot melt adhesive that exhibits a melting temperature in its uncured state of 50 to 150° C., preferably of 115 to 135° C. and exhibits a pot life of ≤90 minutes after melting. Most preferably, the hot melt adhesive (23) in its uncured state comprises a polyurethane resin (e.g., Mor-Melt™ R5003 available from Rohm and Haas).

The chemical mechanical polishing pad (10) provided in the method of the present invention is preferably adapted to be interfaced with a platen of a polishing machine. Preferably, the chemical mechanical polishing pad (10) provided in the method of the present invention is adapted to be affixed to the platen of a polishing machine. The chemical mechanical polishing pad (10) provided in the method of the present invention can be affixed to the platen using at least one of a pressure sensitive adhesive and vacuum.

Preferably, the chemical mechanical polishing pad (10) provided in the method of the present invention includes a pressure sensitive platen adhesive layer (70) applied to the bottom surface (27) of the rigid layer (25). One of ordinary skill in the art will know how to select an appropriate pressure sensitive adhesive for use as the pressure sensitive platen adhesive layer (70). Preferably, the chemical mechanical polishing pad (10) provided in the method of the present invention will also include a release liner (75) applied over the pressure sensitive platen adhesive layer (70), wherein the pressure sensitive platen adhesive layer (70) is interposed between the bottom surface (27) of the rigid layer (25) and the release liner (75). (See FIGS. 2 and 7-10).

An important step in substrate polishing operations is determining an endpoint to the process. One popular in situ method for endpoint detection involves providing a polishing pad with an endpoint detection window, which is transparent to select wavelengths of light. During polishing, a light beam is directed through the endpoint detection window to the wafer surface, where it reflects and passes back through the endpoint detection window to a detector (e.g., a spectrophotometer). Based on the return signal, properties of the substrate surface (e.g., the thickness of films thereon) can be determined for endpoint detection. To facilitate such light based endpoint methods, the chemical mechanical polishing pad (10) provided in the method of the present invention, optionally further comprises an endpoint detection window (30). Preferably, the endpoint detection window is selected from an integral window (34) incorporated into the polishing layer (20); and, a plug in place window block (32) incorporated into the chemical mechanical polishing pad (10). (See FIGS. 1-10). One of ordinary skill in the art will know to select an appropriate material of construction for the endpoint detection window for use in the intended polishing process.

Preferably, the endpoint detection window used in the chemical mechanical polishing pad (10) provided in the method of the present invention is an integral window (34) incorporated into the polishing layer (20). Preferably, the chemical mechanical polishing pad (10) provided in the method of the present invention containing the integral window (34), comprises: a polishing layer (20) having a polishing surface (14), a base surface (17) and an average thickness, $T_{P-avg}$, measured in a direction perpendicular to the polishing surface (14) from the polishing surface (14) to the base surface (17); a rigid layer (25) having a top surface (26) and a bottom surface (27); a hot melt adhesive (23) interposed between the base surface (17) of the polishing layer (20) and the top surface (26) of the rigid layer (25); wherein the hot melt adhesive (23) bonds the polishing layer (20) to the rigid layer (25); a pressure sensitive platen adhesive (70); a release liner (75); wherein the pressure sensitive platen adhesive (70) is interposed between the bottom surface (27) of the rigid layer (25) and the release liner (75); and, the integral window (34) incorporated into the polishing layer (20); wherein the polishing layer (20) exhibits a specific gravity of greater than 0.6; a Shore D hardness of 60 to 90 (preferably, >60 to 75; more preferably, 61 to 75; most preferably, >65 to 70); and, an elongation to break of 100 to 300% (preferably, 100 to 200%; more preferably, 125 to 175%; most preferably, 150 to 160%); wherein the polishing layer (20) exhibits an initial hydrolytic stability, wherein a linear dimension of a sample of the polishing layer changes by <1% following immersion in deionized water for 24 hours at 25° C. (as measured according to the method described in the Examples); wherein the polishing layer (20) exhibits a sustained hydrolytic instability, wherein the linear dimension of the sample of the polishing layer changes by ≥1.75% (preferably, 1.75 to 5%; more preferably, 1.75 to 3.5%; most preferably, 2 to 3%) following immersion in deionized water for seven days at 25° C. (as measured according to the method described in the Examples); wherein the polishing layer (20) has a polishing surface (14) adapted for polishing a substrate. The integral window (34) preferably has a thickness, $T_W$, measured along an axis, B, perpendicular to the plane (28) of the polishing surface (14). (See FIG. 10). Preferably, the integral window (34) has an average thickness, $T_{W-avg}$, along an axis (B) perpendicular to the plane (28) of the polishing surface (25), wherein the average window thickness, $T_{W-avg}$, is equal to the average thickness, $T_{P-avg}$, of the polishing layer (20). (See FIG. 10).

Preferably, the endpoint detection window used in the chemical mechanical polishing pad (10) provided in the method of the present invention is a plug in place window block (32). Preferably, the chemical mechanical polishing pad (10) provided in the method of the present invention containing the plug in place window block (32), comprises: a polishing layer (20) having a polishing surface (14), a base surface (17) and an average thickness, $T_{P-avg}$, measured in a direction perpendicular to the polishing surface (14) from the polishing surface (14) to the base surface (17); a rigid layer (25) having a top surface (26) and a bottom surface (27); a hot melt adhesive (23) interposed between the base surface (17) of the polishing layer (20) and the top surface (26) of the rigid layer (25); wherein the hot melt adhesive (23) bonds the polishing layer (20) to the rigid layer (25); a pressure sensitive platen adhesive (70); a release liner (75); wherein the pressure sensitive platen adhesive (70) is interposed between the bottom surface (27) of the rigid layer (25) and the release liner (75); and, a plug in place window (32) incorporated into the chemical mechanical polishing pad (10); wherein the polishing layer (20) exhibits a specific gravity of greater than 0.6; a Shore D hardness of 60 to 90 (preferably, >60 to 75; more preferably, 61 to 75; most preferably, >65 to 70); and, an elongation to break of 100 to 300% (preferably, 100 to 200%; more preferably, 125 to 175%; most preferably, 150 to 160%); wherein the polishing layer (20) exhibits an initial hydrolytic stability, wherein a linear dimension of a sample of the polishing layer changes by <1% following immersion in deionized water for 24 hours at 25° C. (as measured according to the method described in the Examples); wherein the polishing layer (20) exhibits a sustained hydrolytic instability, wherein the linear dimension of the sample of the polishing layer changes by ≥1.75% (preferably, 1.75 to 5%; more preferably, 1.75 to 3.5%; most preferably, 2 to 3%) following immersion in deionized water for seven days at 25° C. (as measured according to the method described in the Examples); wherein the polishing layer (20) has a polishing surface (14) adapted for polishing a substrate; wherein the chemical mechanical polishing pad (10) has a through opening (35) that extends through the chemical mechanical polishing pad (10) from the polishing surface (14) of the polishing layer (20) through to the bottom surface (27) of the rigid layer (25); wherein the plug in place window block (30) is disposed within the through opening (35); and, wherein the plug in place window block (30) is secured to the pressure sensitive platen adhesive (70). The plug in place window block (30) has a thickness, $T_W$, measured along an axis, B, perpendicular to the plane (28) of the polishing surface (14). (See FIGS. 5-7). Preferably, the plug in place window block (30) used in the chemical mechanical polishing pad (10) provided in the method of the present invention has an average window thickness, $T_{W-avg}$, along an axis (B) perpendicular to the plane (28) of the polishing surface (25), wherein the average window thickness, $T_{W-avg}$, is 5 mils to the average total thickness, $T_{T-avg}$, of the chemical mechanical polishing pad (10). (See FIG. 7). More preferably, wherein the plug in place window block (30) used in the chemical mechanical polishing pad (10) provided in the method of the present invention has an average window thickness, $T_{W-avg}$, of 5 mils to <$T_{T-avg}$. Still more preferably, wherein the plug in place window block (30) has an average window thickness, $T_{W-avg}$, of 5 mils to 75 mils (yet still more preferably, 15 to 50 mils; most preferably 20 to 40 mils). (See FIGS. 5-7).

Preferably, the endpoint detection window used in the chemical mechanical polishing pad (10) provided in the method of the present invention is a plug in place window block (32). Preferably, the chemical mechanical polishing pad (10) provided in the method of the present invention containing the plug in place window block (32), comprises: a polishing layer (20) having a polishing surface (14), a base surface (17), an average thickness, $T_{P\text{-}avg}$, measured in a direction perpendicular to the polishing surface (14) from the polishing surface (14) to the base surface (17), and a counterbore opening (40) that enlarges a through passage (35) that extends through the thickness, $T_P$, of the polishing layer (20), wherein the counterbore opening (40) opens on the polishing surface (14) and forms a ledge (45) at an interface between the counterbore opening (40) and the through passage (35) at a depth, $D_O$, along an axis, B, parallel with an axis, A, and perpendicular to the plane (28) of the polishing surface (14). (See FIGS. 1, 4, 6 and 8). Preferably, the ledge (45) is parallel with the polishing surface (14). Preferably, the counterbore opening defines a cylindrical volume with an axis that is parallel to axis (A). Preferably, the counterbore opening defines a non-cylindrical volume. Preferably, the plug in place window block (32) is disposed within the counterbore opening (40). Preferably, the plug in place window block (32) is disposed within the counterbore opening (40) and adhered to the polishing layer (20). Preferably, the plug in place window block (32) is adhered to the polishing layer (20) using at least one of ultrasonic welding and an adhesive. Preferably, the average depth of the counterbore opening, $D_{O\text{-}avg}$, along an axis, B, parallel with an axis, A, and perpendicular to the plane (28) of the polishing surface (14) is 5 to 75 mils (preferably 10 to 60 mils; more preferably 15 to 50 mils; most preferably, 20 to 40 mils). Preferably, the average depth of the counterbore opening, $D_{O\text{-}avg}$, is ≤ the average thickness, $T_{W\text{-}avg}$, of the plug in place window block (32). (See FIGS. 6 and 8). More preferably, the average depth of the counterbore opening, $D_{O\text{-}avg}$, satisfies the following expression $$0.90*T_{W\text{-}avg} \leq D_{O\text{-}avg} \leq T_{W\text{-}avg}.$$

More preferably, the average depth of the counterbore opening, $D_{O\text{-}avg}$, satisfies the following expression $$0.95*T_{W\text{-}avg} \leq D_{O\text{-}avg} \leq T_{W\text{-}avg}.$$

Preferably, the endpoint detection window used in the chemical mechanical polishing pad (10) provided in the method of the present invention is a plug in place window block (32). Preferably, the chemical mechanical polishing pad (10) provided in the method of the present invention containing the plug in place window block (32), comprises: a polishing layer (20) having a polishing surface (14), a base surface (17), an average thickness, $T_{P\text{-}avg}$, measured in a direction perpendicular to the polishing surface (14) from the polishing surface (14) to the base surface (17), and a polishing layer opening (37) that enlarges a through passage (35) that extends through the total thickness, $T_T$, of the chemical mechanical polishing pad (10), wherein the polishing layer opening (37) opens on the polishing surface (14) and forms a shelf (55) on the top surface (26) of the rigid layer (25) at an interface between the polishing layer opening (37) and the through passage (35) at a depth, $D_O$, along an axis, B, parallel with an axis, A, and perpendicular to the plane (28) of the polishing surface (14). (See FIGS. 1, 4, 6 and 9). Preferably, the shelf (55) is parallel with the polishing surface (14). Preferably, the polishing layer opening (37) defines a cylindrical volume with an axis that is parallel to axis (A). Preferably, the polishing layer opening (37) defines a non-cylindrical volume. Preferably, the plug in place window block (32) is disposed within the polishing layer opening (37). Preferably, the plug in place window block (32) is disposed within the polishing layer opening (37) and adhered to the top surface (26) of the rigid layer (25). Preferably, the plug in place window block (32) is adhered to the top surface (26) of the rigid layer (25) using at least one of ultrasonic welding and an adhesive. Preferably, the average depth of the counterbore opening, $D_{O\text{-}avg}$, along an axis, B, parallel with an axis, A, and perpendicular to the plane (28) of the polishing surface (14) is 5 to 75 mils (preferably 10 to 60 mils; more preferably 15 to 50 mils; most preferably, 20 to 40 mils). Preferably, the average depth of the counterbore opening, $D_{O\text{-}avg}$, is ≤ the average thickness, $T_{W\text{-}avg}$, of the plug in place window block (32). (See FIGS. 6 and 9). More preferably, the average depth of the counterbore opening, $D_{O\text{-}avg}$, satisfies the following expression $$0.90*T_{W\text{-}avg} \leq D_{O\text{-}avg} \leq T_{W\text{-}avg}.$$

More preferably, the average depth of the counterbore opening, $D_{O\text{-}avg}$, satisfies the following expression $$0.95*T_{W\text{-}avg} \leq D_{O\text{-}avg} \leq T_{W\text{-}avg}.$$

The chemical mechanical polishing pad (10) provided in the method of the present invention includes at least one additional layer interfaced with and interposed between the bottom surface of the rigid layer and the stack side of the pressure sensitive platen adhesive layer. Preferably, the at least one additional layer is interfaced with the bottom surface of the rigid layer using a pad adhesive. The pad adhesive may be selected from pressure sensitive adhesives, hot melt adhesives, contact adhesives and combinations thereof. Preferably, the pad adhesive is a hot melt adhesive or a pressure sensitive adhesive. More preferably, the pad adhesive is a hot melt adhesive.

Preferably, the method of chemical mechanical polishing a substrate of the present invention, further comprises: providing a polishing medium; and, dispensing the polishing medium at an interface between the polishing surface of the chemical mechanical polishing pad and a surface of the substrate. The term "polishing medium" as used herein and in the appended claims encompasses particle containing polishing solutions and non particle containing solutions, such as abrasive free and reactive liquid polishing solutions.

Some embodiments of the present invention will now be described in detail in the following Examples.

EXAMPLE 1

Preparation of Polishing Layer

A cast polyurethane cake was prepared by the controlled mixing of (a) an isocyanate terminated prepolymer at 51° C. obtained by the reaction of a polyfunctional isocyanate (i.e., toluene diisocyanate) and a polyether based polyol (i.e., Adiprene® LFG740D commercially available from Chemtura Corporation); (b) a curative agent at 116° C. (i.e., 4,4'-methylene-bis-(2-chloroaniline)); and, (c) 0.3 wt % of a hollow core filler (i.e., 551DE40d42 Expancel® microspheres commercially available from Akzo Nobel). The ratio of the isocyanate terminated prepolymer and the curative agent was set such that the stoichiometry, as defined by the ratio of active hydrogen groups (i.e., the sum of the —OH groups and —NH$_2$ groups) in the curative agent to the unreacted isocyanate (NCO) groups in the isocyanate terminated prepolymer, was 91 percent. The hollow core filler was mixed into the isocyanate terminated prepolymer prior to the addition of the curative agent. The isocyanate terminated prepolymer with the incorporated hollow core filler and the curative agent were then mixed together using a high shear mix head. After exiting the mix head, the combination was dispensed over a period of 5 minutes into a 86.4 cm (34 inch) diameter circular mold to give a total pour thickness of approximately 8 cm (3 inches). The dispensed combination was allowed to gel for 15 minutes before placing the mold in a curing oven. The mold was then cured in the curing oven using the following cycle: 30 minutes ramp of the oven set point temperature from ambient temperature to 104° C., then hold for 15.5 hours with an oven set point temperature of 104° C., and then 2 hour ramp of the oven set point temperature from 104° C. down to 21° C.

The cured polyurethane cakes were then removed from the mold and skived (cut using a moving blade) at a temperature of 30 to 80° C. into multiple polishing layers having an average thickness, $T_{P-avg}$, of 2.0 mm (80 mil). Skiving was initiated from the top of each cake.

Analysis of Polishing Layer Properties

The ungrooved, polishing layer material prepared according to Example 1 was analyzed to determine its physical properties as reported in TABLE 1. Note that the specific gravity reported was determined relative to pure water according to ASTM D1622; the Shore D hardness reported was determined according to ASTM D2240.

The tensile properties of the polishing layer (i.e., median tensile strength, median elongation to break, median modulus, toughness) were measured according to ASTM D412 using an Alliance RT/5 mechanical tester available from MTS Systems Corporation as a crosshead speed of 50.8 cm/min. All testing was performed in a temperature and humidity controlled laboratory set at 23° C. and a relative humidity of 50%. All of the test samples were conditioned under the noted laboratory conditions for 5 days before performing the testing. The reported median tensile strength (MPa) and median elongation to break (%) for the polishing layer material was determined from stress-strain curves of five replicate samples.

The storage modulus, G', and loss modulus, G", of the polishing layer material was measured according to ASTM D5279-08 using a TA Instruments ARES Rheometer with torsion fixtures. Liquid nitrogen that was connected to the instrument was used for sub-ambient temperature control. The linear viscoelastic response of the samples was measured at a test frequency of 10 rad/sec (1.59 Hz) with a temperature ramp of 3° C./min from –100° C. to 200° C. The test samples were stamped out of the polishing layer using a 47.5 mm×7 mm die on an Indusco hydraulic swing arm cutting machine and then cut down to approximately 35 mm in length using scissors.

TABLE 1

| Polishing layer Property | Ex. 1 polishing layer material |
|---|---|
| Hardness Shore D 15 Sec. | 66.0 |
| G' @ 30° C. | 241.0 MPa |
| G' @ 40° C. | 210.6 MPa |
| G" @ 40° C. | 15.9 MPa |
| G' @ 30° C./G' @ 90° C. | 2.5 |
| G' @ 90° C. | 95.5 MPa |
| Median Tensile Strength | 33.2 MPa |
| Median elongation to break | 155.3% |
| Median Modulus | 391.0 MPa |
| Toughness | 44.5 MPa |
| Specific gravity | 1.072 |

Hydrolytic Stability Analysis

The ungrooved, polishing layer material prepared according to Example 1 was then analyzed to determine whether it exhibited an initial hydrolytic stability and a sustained hydrolytic instability. Three commercially available polishing layer materials were also analyzed (i.e., IC1000™ polishing layer material; VisionPad™ 3100 polishing layer material and VisionPad™ polishing layer material all available from Rohm and Haas Electronic Materials CMP Inc.). Commercial pad specifications for the commercial polishing layer materials are provided in TABLE 2. Specifically, 1.5"×1.5" samples of each of the 2 mm thick polishing layer materials were initially measured along both 1.5" dimensions (i.e., x and y dimension) using a calipers. The samples were then immersed in deionized water at 25° C. The samples were again measured along both the x and y dimension using calipers after 24 hours of immersion and seven days of immersion. The results of these measurements are provided in TABLE 3.

TABLE 2

| | Commercial Pad Specification | | | |
|---|---|---|---|---|
| | Average SG[η] | | Shore D Hardness | |
| Pad Material | LSL[Æ] | USL[£] | LSL[Æ] | USL[£] |
| IC1000™ A2 | 0.74 | 0.85 | 52 | 62 |
| VP3100™ | 0.76 | 0.84 | 42.5 | 49.5 |
| VP5200™ | 0.64 | 0.70 | 44 | 60 |

[η] "SG" means specific gravity
[Æ] "LSL" means lower specification limit
[£] "USL" means upper specification limit

TABLE 3

| | Linear measurement (in inches) | | | 24 hr | 7 day |
|---|---|---|---|---|---|
| Material | Initial | 24 hrs | 7 Days | % Δ | % Δ |
| Ex. 1 (x) | 1.52 | 1.53 | 1.56 | 0.66 | 2.63 |
| Ex. 1 (y) | 1.51 | 1.52 | 1.55 | 0.66 | 2.65 |
| IC1000™ A2 (x) | 1.52 | 1.52 | 1.53 | 0 | 0.66 |
| IC1000™ A2 (y) | 1.51 | 1.52 | 1.52 | 0.66 | 0.66 |
| VP3100™ (x) | 1.51 | 1.52 | 1.52 | 0.66 | 0.66 |
| VP3100™ (y) | 1.52 | 1.52 | 1.52 | 0 | 0 |
| VP5200™ (x) | 1.52 | 1.52 | 1.53 | 0 | 0.66 |
| VP5200™ (y) | 1.52 | 1.52 | 1.53 | 0 | 0.66 |

We claim:

1. A method of chemical mechanical polishing a substrate, comprising:

providing a substrate selected from at least one of a magnetic substrate, an optical substrate and a semiconductor substrate;

providing a chemical mechanical polishing pad, comprising:

a polishing layer having a composition and a polishing surface, wherein the composition of the polishing layer is selected to exhibit (i) an initial hydrolytic stability, wherein a linear dimension of a sample of the polishing layer changes by <1% following immersion in deionized water for 24 hours at 25 ° C.; coupled with (ii) a sustained hydrolytic instability, wherein the linear dimension of the sample of the polishing layer changes by >1.75% following immersion in deionized water for seven days at 25° C.;

a rigid layer having a top surface and a bottom surface, wherein the rigid layer exhibits a Young's Modulus of at least 100 MPa;

a hot melt adhesive interposed between the base surface of the polishing layer and the top surface of the rigid layer; wherein the hot melt adhesive bonds the polishing layer to the rigid layer;

a pressure sensitive platen adhesive layer having a stack side and a platen side; wherein the stack side of the pressure sensitive platen adhesive layer is adjacent to the bottom surface of the rigid layer;

optionally, a release liner; wherein the optional release liner is disposed on the platen side of the pressure sensitive platen adhesive layer;

optionally, an endpoint detection window; and, optionally, at least one additional layer interfaced with and interposed between the bottom surface of the rigid layer and the stack side of the pressure sensitive platen adhesive layer; and, creating dynamic contact between the polishing surface and substrate to polish a surface of the substrate.

2. The method of claim 1, wherein the substrate is a semiconductor substrate.

3. The method of claim 2, wherein the semiconductor substrate has an exposed copper surface; and, wherein at least some of the exposed copper surface is polished away from the surface of the substrate.

4. The method of claim 3, wherein the chemical mechanical polishing pad provided has at least one additional layer interfaced with and interposed between the bottom surface of the rigid layer and the stack side of the pressure sensitive platen adhesive layer.

5. The method of claim 1, wherein the polishing layer is a cast polyurethane, wherein the cast polyurethane is a reaction product of ingredients, comprising:

an isocyanate terminated urethane prepolymer obtained by reaction of:
  a toluene diisocyanate; and,
  a polypropylene glycol based polyol;
  wherein the isocyanate terminated urethane prepolymer has greater than 8.7 to 9 wt % unreacted NCO;

a curative agent, wherein the curative agent is 4,4'-methylene-bis-(2-chloroaniline); and, optionally, a plurality of microelements;

wherein the polishing layer exhibits a Shore D hardness of 60 to 90; and, an elongation to break of 100 to 300%; and, wherein the polishing surface is adapted for polishing the substrate.

6. The method of claim 5, wherein the curative and the isocyanate terminated prepolymer have an OH or $NH_2$ to unreacted NCO stoichiometric ratio of 80 to 120 percent.

7. The method of claim 1, wherein the top surface of the rigid layer is ungrooved; and wherein the bottom surface of the rigid layer is ungrooved.

8. The method of claim 1, wherein the top surface and the bottom surface of the rigid layer have a roughness, Ra, of 1 to 500 nm.

9. The method of claim 1, wherein the rigid layer is made of a biaxially oriented polyethylene terephthalate; wherein the rigid layer has an average thickness of 6 to 15 mils; and, wherein the rigid layer exhibits a Young's Modulus of 3,000 to 7,000 MPa.

10. The method of claim 1, wherein the chemical mechanical polishing pad provided has an endpoint detection window.

11. The method of claim 1, wherein the rigid layer is made of a material selected from the group consisting of a polymer, a metal, a reinforced polymer and combinations thereof.

* * * * *